(12) United States Patent
Wolff et al.

(10) Patent No.: US 11,002,787 B2
(45) Date of Patent: May 11, 2021

(54) SCALABLE PLATFORM FOR SYSTEM LEVEL TESTING

(71) Applicant: Advantest Corporation, Tokyo (JP)

(72) Inventors: Roland Wolff, Santa Rosa, CA (US);
Mei-Mei Su, Mountain View, CA (US);
Ben Rogel-Favila, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 473 days.

(21) Appl. No.: 15/913,673

(22) Filed: Mar. 6, 2018

(65) Prior Publication Data
US 2019/0277907 A1    Sep. 12, 2019

(51) Int. Cl.
*G01R 31/28* (2006.01)
*G01R 1/04* (2006.01)

(52) U.S. Cl.
CPC ....... *G01R 31/2834* (2013.01); *G01R 1/0416* (2013.01); *G01R 31/2844* (2013.01)

(58) Field of Classification Search
CPC ............ G01R 31/2834; G01R 1/0416; G01R 31/2844; G01R 31/31907; G01R 31/2868; G06F 11/3688

USPC ..................................... 324/750.25
See application file for complete search history.

(56) References Cited

U.S. PATENT DOCUMENTS

| | | | |
|---|---|---|---|
| 2003/0030459 A1* | 2/2003 | Sabey ............... | G01R 31/2805 324/750.19 |
| 2004/0225459 A1* | 11/2004 | Krishnaswamy ......................... | G01R 31/318307 702/57 |
| 2018/0024178 A1* | 1/2018 | House .................. | G01R 29/26 324/613 |

* cited by examiner

*Primary Examiner* — Farhana A Hoque

(57) ABSTRACT

A scalable test platform can include one or more of a plurality of different device interface boards and a plurality of primitives. The different device interface boards can be configured to provide a uniform interface to couple different types of DUTs and or DUTs with different form factors to the plurality of primitives. The plurality of primitives can be configured to distribute power to the DUTs, and to perform system level testing of the respective DUTs. The plurality of primitives can be configurable by a user to perform any number of system level tests on a number of different types of DUTs and or DUTs with different form factors.

32 Claims, 9 Drawing Sheets

705 Providing a plurality of device interface boards from a number of different types of device interface boards, the different types of device interface boards configured for coupling a respective type or form factor of devices under test (DUT) to a plurality of primitives

710 Providing the plurality of primitives configured to distribute power to devices under test (DUTs) coupled to the plurality of device interface boards and to independently perform user configurable system level testing of DUTs coupled to the device interface boards

715 Providing one or more primitive racks configured to house the plurality of primitives

720 Providing a host controller for configuring the plurality of modular primitives to independently perform the user configurable system level testing

725 Providing one or more back planes configured to couple the host controller to the plurality of primitives and to couple power to the plurality of primitives

730 Providing one or more modular automation components configured to manipulate coupling and uncoupling of the DUTs from the device interface boards

SCALABLE PLATFORM FOR SYSTEM LEVEL TESTING

BACKGROUND OF THE INVENTION

Electronic systems have made significant contributions toward the advancement of modern society and are utilized in a number of applications to achieve advantageous results. Numerous devices, such as desktop personal computers (PCs), laptop PCs, tablet PCs, netbooks, smart phones, servers, and components thereof have facilitated increased productivity and reduced costs in communicating and analyzing data in most areas of entertainment, education, business, and science. These electronic systems and devices are typically tested to ensure proper operation. While testing of the systems and devices has made significant advances, traditional approaches are typically expensive and often have limitations with regards to throughput and convenience.

Conventional test systems are generally single point solutions that are fixedly defined. Conventional systems are not typically well suited for volume production because: 1) the systems are expensive to build and operate; and 2) physical manipulation (e.g., insertion, removal, etc.) of the devices under test is labor intensive. In addition, the test systems are not readily adaptable to the changing needs of users to test different types of DUTs with different form factors. Accordingly, there is a continuing need for improved test system that are readily adaptable to the changing needs of users to test different types of DUTs with different form factors.

SUMMARY OF THE INVENTION

The present technology may best be understood by referring to the following description and accompanying drawings that are used to illustrate embodiments of the present technology directed toward a scalable platform for system level testing.

In aspects, a modular test system can include a plurality of primitives that can provide for system level testing of DUTs, integration with autonomous test processing of the DUTs, thermal control of the DUTs during testing, and debugging DUTs that fail the system level testing. The primitives can advantageously provide a scalable test system by the addition or removal of primitives from the test system.

In aspects, the provisioning of a test platform can include providing a plurality of device interface boards from a number of different types of device interface boards. The different types of device interface boards can be configured for coupling a respective type or form factor of devices under test (DUT) to a plurality of primitives. Primitives configured to distribute power to devices under test (DUTs) coupled to the plurality of device interface boards and to independently perform user configurable system level testing of DUTs coupled to the device interface boards can also be provided.

Provisioning of the test platform can also include providing primitive racks to house the modular primitives, a host controller for configuring the primitives, modular automation components for automating testing by the primitives, modular environmental controls, debug components for determining fault location information for DUTs that fail the system level testing, and combinations thereof.

In aspects, a distributed test platform can include a plurality of user selectable device interface boards and a plurality of modular primitives. Different types of device interface boards can be configured to couple DUTs, of a respective type or form factor, to the modular primitives. The primitives can be configured to independently perform user configurable system level functional testing of DUTs coupled by the device interface boards to the modular primitives. The platform can also include robotic components, environmental components and debugging components that can be mixed and matched with the primitives and device interface boards to implement a scalable test system that can be utilized to test various types of electronic device along with electronic devices in different form factors. The modular test system can be readily configured and re-configured to adapt to the changing and varied needs from user to user.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 7A and 7B show a flow diagram of a scalable test platform method, in accordance aspects of the present technology.

DETAILED DESCRIPTION OF THE INVENTION

Figure 1:
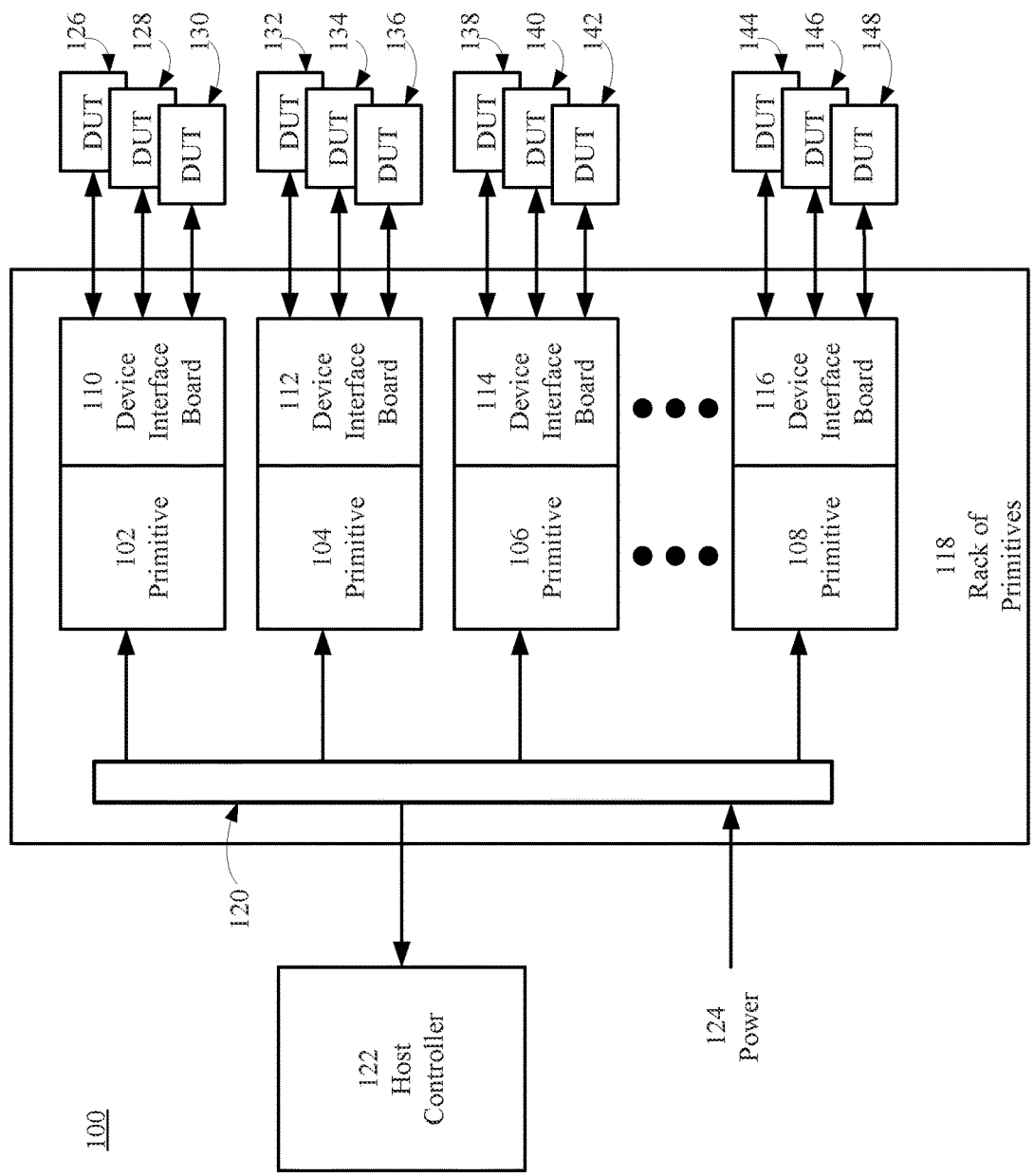
FIG. 1 shows a block diagram of a test platform, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Aspects of the present technology address customer demand for highly variable and scalable test systems for testing devices, including system level attributes such as device form factor, testing speed, thermal requirements, automation and handling, test electronics, test software and debug capabilities. For instance, a particular user may not be interested in testing software because they have their own test software, but may be more interested in the thermal control and automated handling of the devices during the testing phase. Another user may be interested in running a variety of different test on the DUT at precise parameters such as speed, power consumption and the like. Another customer may be interested in very high-volume processing and therefore automation and handling may be key aspects of their concerns. The system level platform in accordance with aspects of the present technology provide flexibility and scalability in these system level attributes and is therefore able to become readily customizable to a particular customer's needs.

FIG. 1 shows a block diagram of a test platform in accordance with aspects of the present technology. The test platform 100 can include a plurality of primitives 102-108, a plurality of device interface boards 110-116, one or more primitive racks 118, one or more back planes 120, and a host controller 122. The one or more primitive racks 118 can be configured to house the plurality of modular primitives 102-108. The primitives 102-108 can have a modular design with standardized dimensions for easy assembly and flexible arrangement in primitive racks 118. The back plane 120 can be configured to couple the host controller 122 to the plurality of primitives 102-108. The back plane 120 can also couple power 124 from an electrical source such as a wall outlet to the plurality of primitives 102-108.

In aspects, the host controller 122 can be configured to install and manage performance of a user configurable system level test on the primitives 102-108. The user can be an in-house or contract DUT designer, DUT manufacturer, DUT tester and/or the like. The primitives 102-108 can be configured to perform user configurable system level testing of Devices Under Test (DUTs) 126-148 coupled to the device interface boards 110-116. The primitives 102-108 can also be configured to distribute power to the DUTs 126-148 coupled to the device interface boards 110-116.

Figure 2:
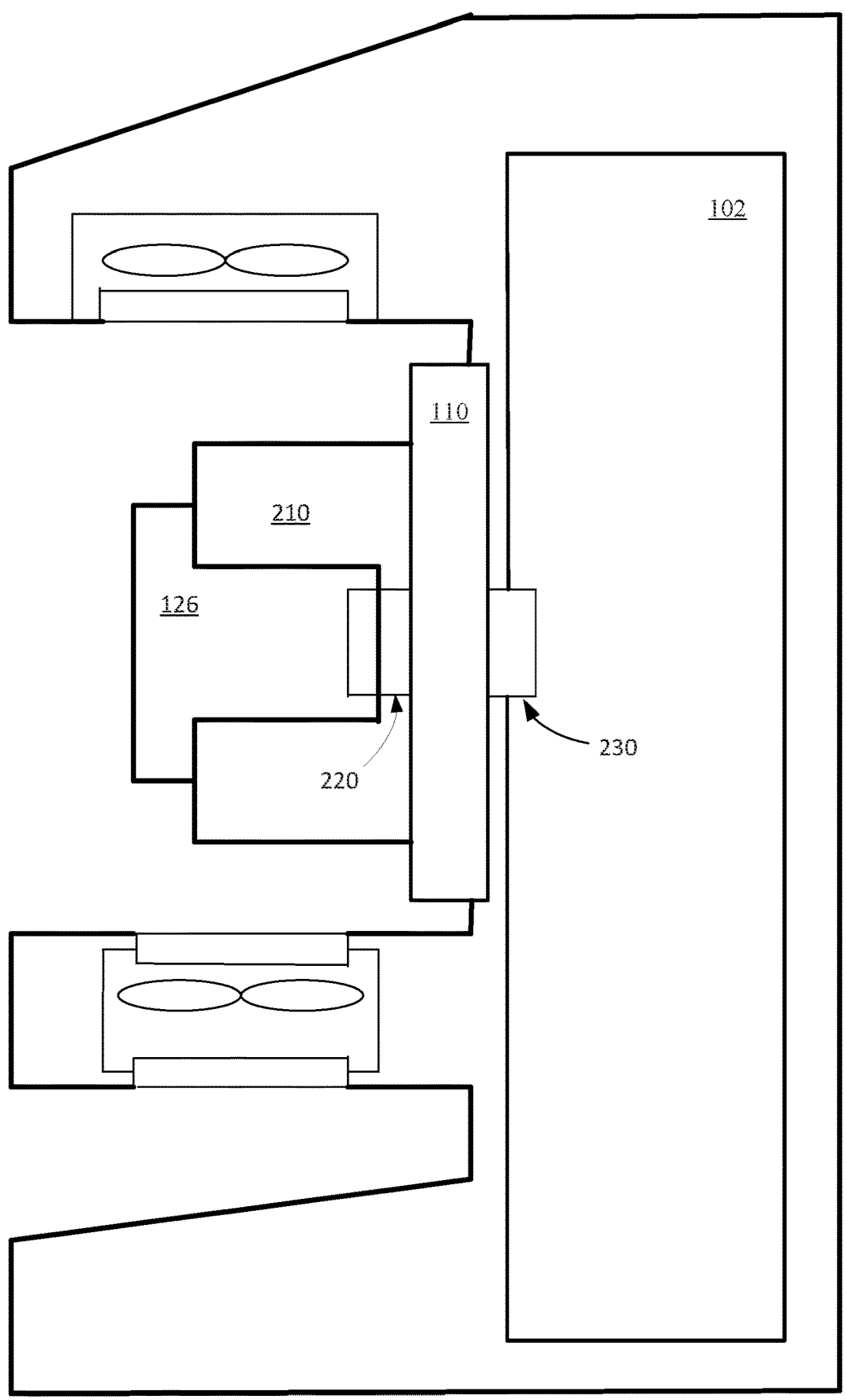
FIG. 2 shows a block diagram of a primitive and respective device interface board, in accordance with aspects of the present technology.

Referring to FIG. 2, a block diagram of a primitive and respective device interface board, in accordance with aspects of the present technology, is shown. The primitives 102 can include one or more slice modules, one or more power supply components, a load board and a backplane interface. The one or more slice modules can be configured to perform the user configurable system level testing of the DUTs 126-130 coupled to the device interface board 110. The one or more power supply components can be configured to receive power from a standard utility outlet, convert the standard utility power into DUT power levels, and control delivery of the power to the DUTs 126-130 coupled to the device interface board 110. In one implementation, the primitive 102 can include a power supply component for each DUT 126-130 coupled to its device interface board 110. A power supply component for each DUT can allow the primitives to collect data concerning power consumption by the respective DUTs during testing. In another implementation, the primitive 102 can include one power supply component for the set of DUTs 126-130 coupled to the device interface board 110. The primitive 102 can include universal primitive interfaces that couple to different device interface boards. The device interface boards can conveniently accommodate different DUT form factors while the configuration or form factor of the universal primitive interface remains similar from one to another. The universal primitive interfaces can include modular connectors that allow easy coupling and decoupling of the device interface board 110 to and from respective primitive 102. The backplane interface can be configured to couple the one or more slice modules and the one or more power supply components to the backplane. The slice modules can be configured to communicate information to the host controller via a standard communication protocol and standard modular removable communication connector. The host controller can be configured to install and manage performance of the user configurable system level test.

In aspect, testing of different types of DUTs 126-148 can be accommodated by changing the device interface boards and loading a corresponding firmware bit file in the primitives 102-108. The device interface boards 110-116 and the primitives 102-108 can also be configured to enable testing of one or more DUTs 126-148 coupled to the device interface boards during manipulation of one or more other DUTs. The device interface boards can include one or more mechanical couplers 210 for securing the DUTs 126-148 of one or more types to the device interface boards 110-116, and one or more electrical couplers 220 for electrically coupling the DUTs 126-148 of one or more types to the device interface boards 110-116. The one or more mechanical couplers can include one or more slots, rails, hangers, bay or the like for coupling DUTs of one or more form factors to the device interface boards. The electrical couplers can include one or more connectors, sockets, plugs or the like for coupling to mating connectors, sockets, plugs or the like on one or more types of DUTs, to couple signal and power between the device interface boards 110-116 and the DUTs 126-148. The device interface boards 110-116 can also include a common interface 230 to couple to the primitives 102-108.

In aspects, the primitives 102-108 of the test system can advantageously provide for system level testing of varying types of DUTs 126-148, integration with autonomous test processing of DUTs 126-148, thermal control of DUTs 126-148 during testing, and debugging DUTs 126-148 that fail the system level testing performed by the primitives 102-108. The primitives 102-108 can advantageously provide a scalable test system by the addition or removal of primitives from the test system.

In aspects, the plurality of primitives 102-108 can be configured to perform user configurable system level testing of the DUTs coupled to the device interface boards. The system level testing can include research and development cycle testing that includes design verification testing, reliability demonstration testing and/or the like. The system level testing can also, or in the alternative, include production cycle testing such as built-in self-testing, full-speed functional testing, and/or the like.

In aspects, a user can utilize the host controller 122 to install a particular user configurable system level test on the plurality of primitives 102-108. The slice modules of the primitives 102-108 can include Field Programmable Gate Arrays (FPGAs) that can be programmed for different test protocols by loading different configuration firmware bit files. For example, the user can utilize the host controller 122 to program one or more FPGAs on the primitives 102-108 with a firmware instantiation of a full functional test, a Built-In Self-Test (BIST) controller, or similar user configurable system level test. In one implementation, the host controller 122 can also be utilized to manage performance of the particular system level test on the plurality of primitives 102-108. For example, the host controller 122 can start and stop testing of the DUTs by the primitives 102-108, and can receive data from the user configurable system level test. Calibration and diagnostic of the plurality of primitives 102-108 can also be performed by the host controller 122.

In aspects, the primitives 102-108 can also include one or more specific test electronics that can be added or removed to further configure the primitives 102-108. For example, a set of primitives 102-108 can include components for implementing full-functional testing of DUTs. If a user wishes to add Built-In Self-Testing (BIST), there is no need to buy a new test system or even new primitives. Instead, the user can replace the full-functional testing components with BIST components. In other instances, testing components may be covered by licenses. For example, if a user wishes to test DUTs that utilize a Serial Attached Small Computer System Interface (SAS), the user can just add the feature by paying for the appropriate license. The primitives 102-108 can be reconfigured to meet new test requirements, instead of removing one tester and replacing the tester with a new tester to provide for the new requirements.

In aspects, the primitives 102-108 of the test system 100 can be utilized for testing various electronics devices including, but not limited to network cards, graphics cards, Hard Disk Drives (HDDs), solid State Drives (SSDs), vehicle electronics, and the like. The modular primitives 102-108 can be configurable for different test methods, different test speeds, different protocol requirements, different device classes (e.g., enterprise consumer) different form factors, different environmental testing conditions, and/or different levels of handling and automation. The primitives 102-108 and device interface boards 1101-116 can be configurable to test DUTs utilizing Non-Volatile Memory Express (NVMe), Periphery Component Interface Express (PCIe), Serial Attached Small Computer System Interface (SAS), Serial ATA (SATA), and the like. The primitives 102-108 and device interface boards 110-116 can be configured to test different form factors of DUTs, including PCIe cards, M.2 devices, U.2 devices and the like. The primitives 102-108 can be configured to test devices operating at 1.5 Gigabits/second (Gbps) to 22.5 Gbps for devices such as generation four of PCIe and SAS 24. The test platform 100 can be configurable to test DUTs in environments ranging from −45° C. to +125° C. to ensure that DUTs such as vehicle electronics can handle a wide range of climates.

Figure 3:
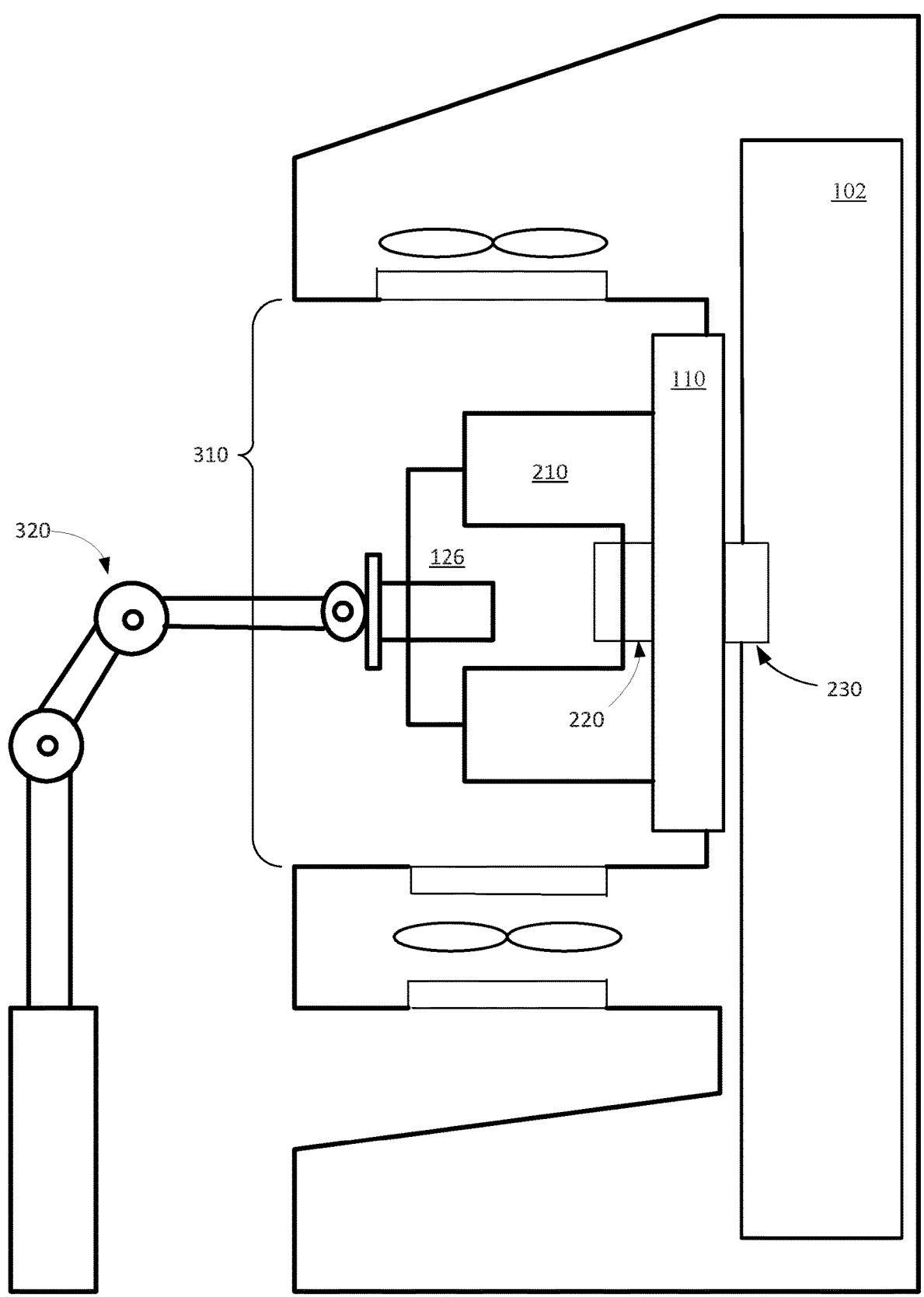
FIG. 3 shows a block diagram of a primitive and respective device interface board, in accordance with aspects of the present technology.

In aspects, a housing of the primitives 102-108 and/or the device interface boards 110-116 can provide access for an operator or robotic handling equipment to the DUTs 126-148. As illustrated in FIG. 3, for example, a housing of the primitives 102- and/or the device interface boards 110-116 can include one or more access interfaces 310. The access interface 310 of the primitives can be configured to enable unobstructed access for robotic 320 manipulation of DUTs 126-130 coupled to the device interface board 110. In one implementation, the robotic equipment 320 can be modularized to enable easy and flexible arrangement of the test system. The robotic equipment 320 can include cartesian actuators, six axis actuators, tracks, pneumatic grippers, electro mechanical gripper, fingers, cameras, pressure sensors, laser range finders and the like that can be mixed and matched to provide for manipulation of DUTs of one or more form factors.

Figure 4:
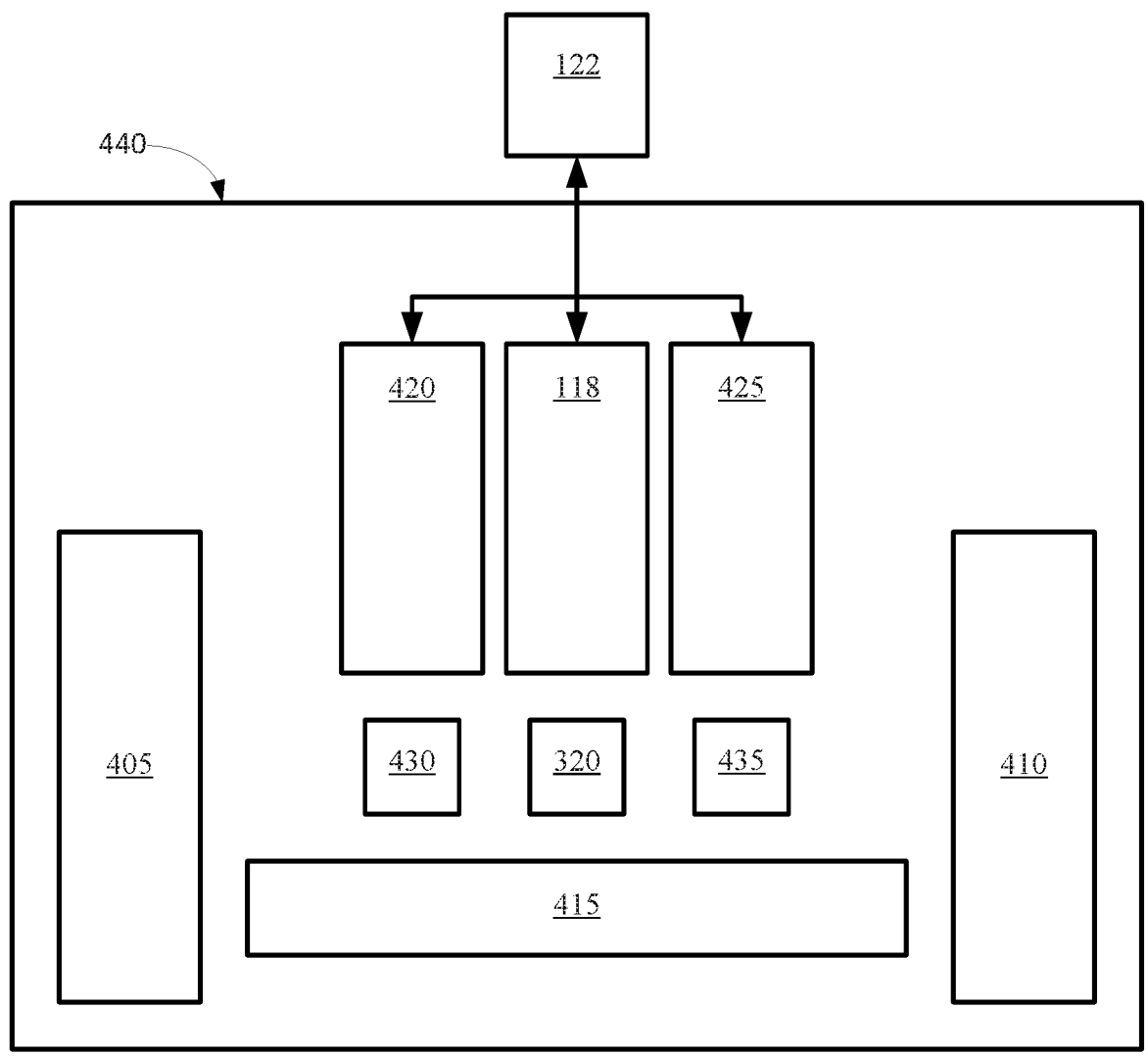
FIG. 4 shows a block diagram of a test platform, in accordance with aspects of the present technology.

In aspects, the test system can also include additional automation equipment, as illustrated in FIG. 4. The automation equipment can also include DUT trays, DUT tray racks 405, 410, conveyor belts 415, Autonomous Guided Vehicles (AGVs), and/or the like. For example, primitives in one or more primitive racks 118, 420, 425 can be configured to provide data from the system level testing of the DUTs to one or more robotic controllers 320, 430, 435. The robotic controllers 320, 430, 435 can be configured to manipulate (e.g., couple and uncouple) the DUTs with respect to the device interface boards, move the DUTs between the device interface boards and conveyor belts 415, DUT trays, DUT tray racks 405, 410, Autonomous Guided Vehicles (AGVs) and/or the like based upon the data received form the primitives.

Figure 5:
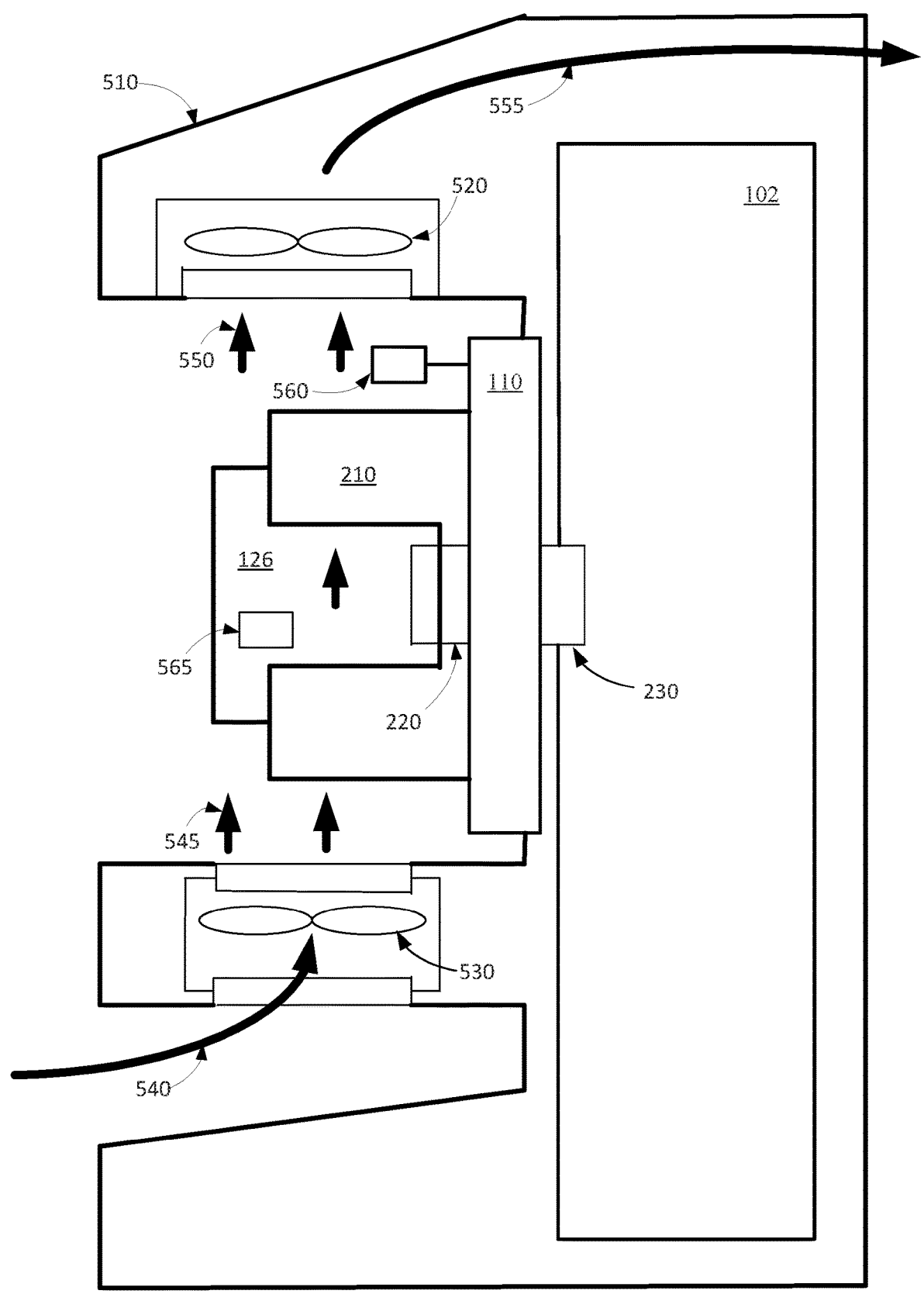
FIG. 5 shows a block diagram of a primitive and respective device interface board, in accordance with aspects of the present technology.

In aspects, the environment conditions of the DUTs can be controlled during system level functional testing by the primitives 102-108. The device interface boards can include one or more environmental components configured to control one or more environmental conditions of the DUTs coupled to the device interface boards. As illustrated in FIG. 5, the primitives 102-108 and/or device interface boards 126-148 can include an enclosure 510 for partially enclosing the DUTs, 126-130, one or more fans 520 disposed adjacent a top of the enclosure 510 above the DUTs 126-130, and one or more fans 530 disposed adjacent a bottom of the enclosure 510 below the DUTs 126-130. The DUTs 126-130 coupled to the device interface board 110 can be arranged in a vertical orientation to allow air 540-555 to flow up along both side of the DUTs 126-130. The fans 520, 530 can be configured to generate a vertical air flow to control cooling of the DUTs 126-130. Air 540-555 can be drawn from the bottom of the enclosure 510 and exhausted out the top of the enclosure 510. Air guides can be included to control a direction and/or volume of air flow past the DUTs 126-130. The one or more fans 520 disposed above the DUTs can be operable at a rotational speed that is greater than a rotational speed of the one or more fans 530 disposed below the DUTs for generation of the vertical air flow.

In aspects, one or more temperature sensors 560 disposed in the enclosure 510 proximate the DUTs 126 can be operable to control the fans 520, 530 to regulate the cooling of the DUTs 126. The primitive 102 can receive data from the temperature sensors 560 and regulate the rotational speed of the fans 520, 530 according to an environmental mechanism of the primitives 102. In addition or in the alternative, the primitive 102 can be configured to received data from one or more temperature sensors 565 in the DUTs 126 for use by the environmental mechanism of the primitive 102. In one implementation, the environmental mechanism can include an environment control algorithm executed by the primitive 102. The test system 100 including primitives and device interface boards can also be utilized within environment chamber 440, as illustrated in FIG. 4, to achieve expanded and/or variable operating environments for testing of the DUTs 126-148.

In aspects, the plurality of primitives 102-108 can be configured to provide for fault detection and fault location. In one implementation, the primitives 102-108 can be configured to provide data from the system level testing of the DUTs for output on a universal Graphical User Interface (GUI) of the host controller 122. The primitives 102-108 can determine and report where a DUT failed, the reason for the failure, and capture operating parameters and interaction of components of the DUTs during the testing that failed. The information can be used to debug and repair the DUTs if applicable.

Figure 6:
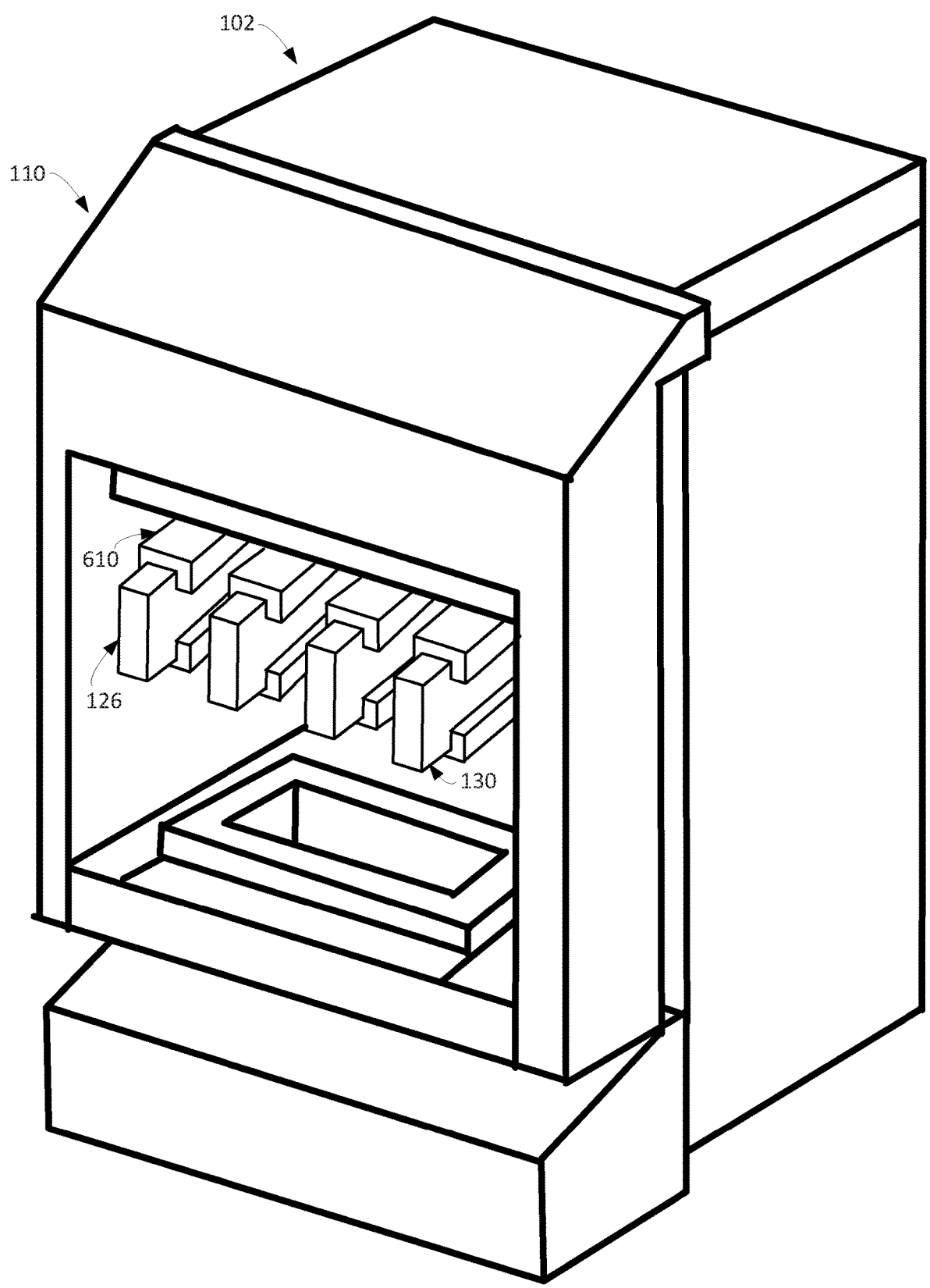
FIG. 6 shows a block diagram of a primitive and respective device interface board, in accordance with aspects of the present technology.

Referring now to FIG. 6, a modular primitive and respective device interface board, in accordance with aspects of the present technology, is shown. The modular device interface board 110 can be any one of a plurality of user selectable device interface boards of different types. The different types of device interface boards are configured to couple a plurality of devices under test (DUTs) of a respective type or form factor to the primitive. The modular primitive 102 can be configured to independently perform user configurable system level functional testing of devices under test (DUTs) 126-130 coupled by the device interface board 110 to the modular primitive 102.

In aspects, the primitive 102 can include a multitude of test slices that provide different electronic test functionality which are configurable by a user. The test slices can control the testing of the DUTs 126-130. In one implementation, the primitive 102 can include Field Programmable Gate Arrays (FPGA) based testing electronics that can be configured to perform user defined system level testing of the DUTs 126-130. The electronic test components can remain in the primitive 102 from one configuration to another, while a firmware configuration file can be readily uploaded to the primitive 102 to accommodate different test approaches and protocols or formats compatible with a given standard.

In aspects, an enclosure of the modular primitive 102 and or device interface board 110 can include an access interface configured to allow operator or robotic manipulation of the devices under test (DUTs) 126-130. The device interface board 110 and the primitive 102 can be configured to enable testing of one or more DUTs 126-130 coupled to the device interface board 110 during the manipulation of one or more other DUTs.

In aspects, the device interface board 110 can include one or more mechanically couplers 610 for securing the DUTs 126-130 of one or more types or form factors to the device interface board 110, and one or more electrical couplers for electrically coupling the DUTs 126-130 to the device interface boards 110. The mechanical couplers 610 can include one or more slots, rails, hangers or bays of one or more types. The electrical couplers can be one or more connectors, sockets or plugs of one or more types that are configured to mate with corresponding connectors, sockets or plugs on the DUTs 126-130.

Figure 7B:
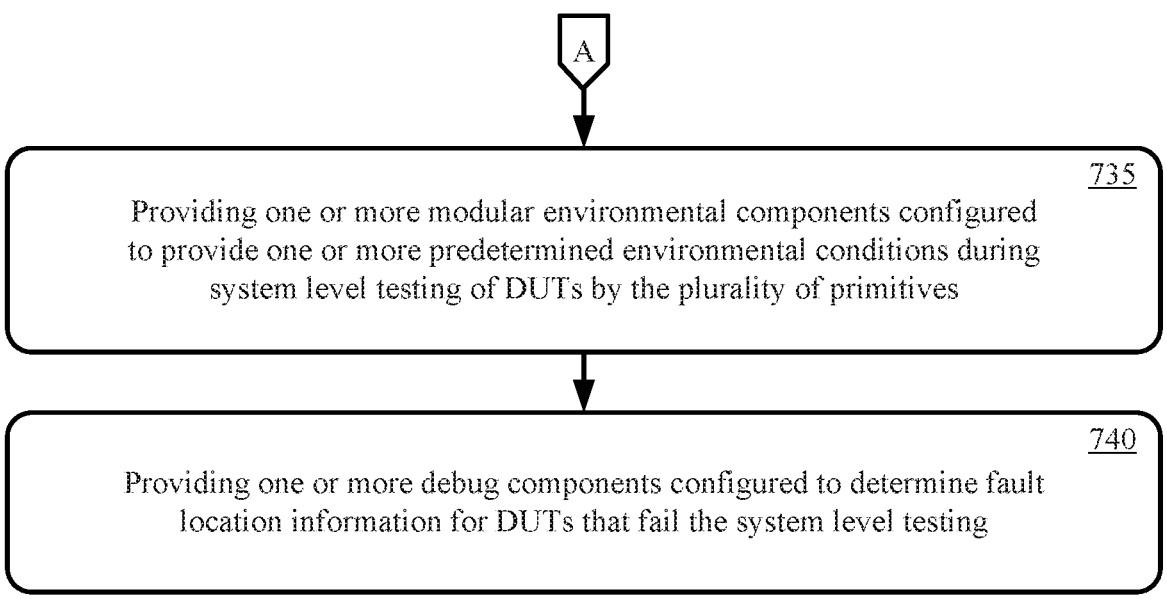

Referring now to FIGS. 7A and 7B, a scalable test platform method, in accordance aspects of the present technology, is shown. The method can include providing a plurality of device interface boards selected by a user from a number of different types of device interface boards 705. The different types of device interface boards can be configured for coupling a respective type of devices under test (DUT) to a plurality of primitives. The device interface boards can have a uniform interface to couple to the primitives, while a DUT specific interface to couple to a given type and/or form factor of a DUT.

A plurality of primitives configured to distribute power to devices under test (DUTs) coupled to the plurality of device interface boards and to independently perform user configurable system level testing of DUTs coupled to the device interface boards can be provided 710. The primitives can include Field Programmable Gate Arrays (FPGA) based testing electronics that can be configured to perform user defined system level testing of the DUTs. The primitives can therefore be re-packetized to implement different platforms, to address different requirements, to address different stages from design validation to high volume manufacture testing of a device.

Optionally, one or more primitive racks configured to house the plurality of primitives can be provided 715. The primitives can be added or removed from the primitive racks dependent upon test system utilization. Additional primitive racks can be added or removed to further scale the test platform.

Optionally, a host controller for configuring the plurality of modular primitives to independently perform the user configurable system level testing can be provided 720. Optionally, one or more back planes configured to couple the host controller to the plurality of primitives and to couple power to the plurality of primitives can also be provided 725. In one implementation, control software executing on the host controller and or the primitives can provide for configuring various aspects of the platform, including test flow and control, characterization, power profiling, calibration and diagnostics, environmental control, and production operator control. The host controller can provide a universal Graphical User Interface (GUI), so that users see the same interface whether working one device verification, research and development testing, high volume manufacturing testing.

Optionally, one or more modular automation components configured to manipulate coupling and uncoupling of the DUTs from the device interface boards can be provided 730. Automation can also be employed to transfer the DUTs between the primitives and conveyors, stackers, DUT trays, DUT tray racks, Autonomous Guided Vehicles (AGVs) and or the like. The automation components can increase test system utilization.

Optionally, one or more modular environmental components configured to provide one or more predetermined environmental conditions during system level testing of DUTs by the plurality of primitives can be provided 735.

Figure 8:
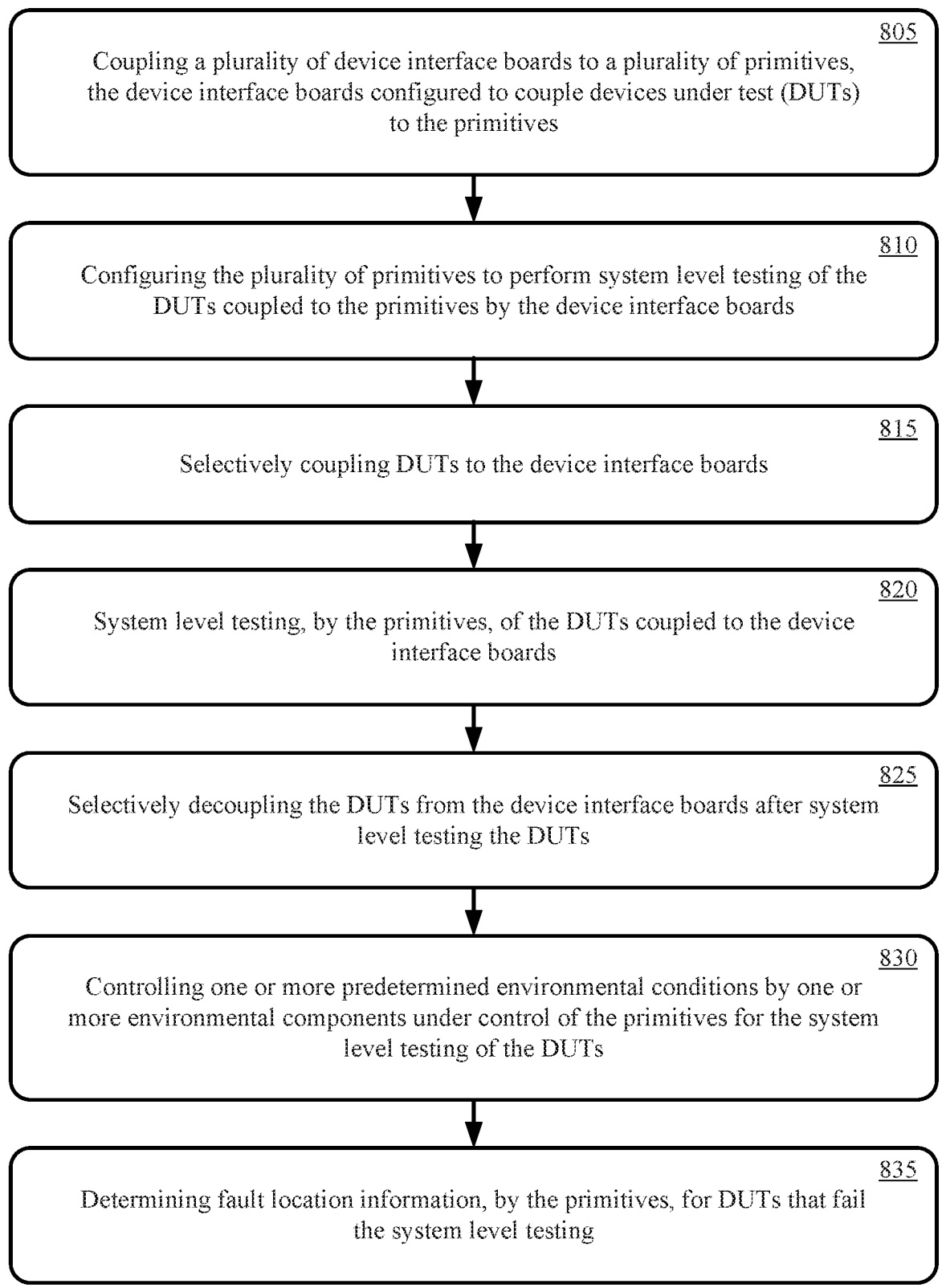
FIG. 8 shows a test method, in accordance with aspects of the present technology.

Optionally, one or more debug components configured to determine fault location information for DUTs that fail the system level testing can be provided 740. The debug components can detect and flag a failing DUT. The debug components can also be configured to determine fault location, identifying the root cause of the failing device. Debug components can optionally create a batch file for log processing, including enhanced data/error logging, Link Training and Status State Machine (LTSSM) capture, Referring now to FIG. 8 a test method, in accordance with aspects of the present technology, is shown. The test method can include coupling a plurality of device interface boards to a plurality of primitives 805. The device interface boards can be configured to couple a number of DUTs to the primitives.

The plurality of primitives can be configured to perform system level testing of the DUTs coupled to the primitives by the device interface boards 810. In one implementation, the primitives can include Field Programmable Gate Arrays (FPGA) based testing electronics that can be configured to perform user defined system level testing of the DUTs.

DUTs can be selectively coupled to the device interface board for testing by the primitives 815. System level testing can be performed by the primitive on the DUTs that are coupled to the device interface boards 820. The DUTs can then be selectively uncoupled from the device interface boards after system level testing of the DUTs 825. In one implementation, the DUTs can be robotically manipulated to selectively couple and uncoupled from the device interface boards. The automation equipment can be modularized to enable easy and flexible arrangement of the test system. The automation equipment can include cartesian actuators, six axis actuators, trackers, pneumatic grippers, electro mechanical gripper, fingers, cameras, pressure sensors, laser range finders and the like that can be mixed and matched to provide for manipulation of DUTs of one or more form factors. In another implementation, the coupling and uncoupling of the DUTs from the device interface boards can be performed manually by one or more test system operators.

Optionally, one or more environmental conditions for the system level testing of the DUTs can be controlled by one or more environmental components under control of the primitives and or a host controller 830. For example, environmental components in primitive and/or device interface board can control the flow of air past the DUTs to control cooling of the DUTs. In another example, an environmental chamber can provide additional control of environmental conditions during testing of the DUTs by the primitives.

Optionally, fault location information can also be determined by the primitives and or a host controller for the DUTs that fail the system level testing 835. The primitives can also characterize the DUTs in response to the system level testing. In one implementation, the primitives can determine if the DUTs pass or fail the user configurable system level test. In another implementation, the primitives can bin the DUTs depending upon their performance during the user configurable system level test. For example, in a two-binning embodiment, the primitive can bin based on pass or fail of the user configurable system level test. In another example, the primitive can bin based on a plurality performance ranges (e.g., bandwidth, power consumption).

In another example, the primitive can bin based on what part of the user configurable system level test the DUT fails.

In aspects, the modular test system in accordance with aspects of the present technology advantageously use common modular components such as primitives, racks, backplanes, host device, and device interface boards to reduce costs. With the use of common modular components, the reliability of the test system can be increased, and the maintenance of the test system can be decreased. The modular test system can be readily configured and re-configured to adapt to the changing and varied needs from user to user. The test system can advantageously provide a scalable, adaptable and customizable system level testing platform that can be applied to a number of electronic devices, in a number of form factors. The test system can readily address customer demands with respect to attributes such as device form factors, testing speeds, thermal requirements, automation and handling, test electronics, test software and debug capabilities.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A test platform comprising:
a plurality of device interface boards (DIBs) including:
one or more slots, rails, hangers or bays of one or more types for coupling a plurality of devices under test (DUTs) of one or more types or form factors to mechanically couple to the device interface boards (DIBs); and
one or more connectors, sockets or plugs of one or more types for coupling to mating connectors, sockets or plugs on one or more types or form factors of devices under tests (DUTs) to couple signals and power between the device interface boards (DIBs) and the devices under tests (DUTs);
a plurality of primitives configured to distribute power to devices under test (DUTs) coupled to device interface boards (DIBs) and to perform user configurable system level testing of the devices under test (DUTs) coupled to the device interface boards (DIBs);
one or more primitive racks configured to modularly house the plurality of primitives;
a host controller configured to install, configure and manage performance of the user configurable system level testing on the plurality of primitives; and
a backplane configured to couple the host controller to the plurality of primitives and to couple power to the plurality of primitives.

2. The test platform of claim 1, wherein the primitives include:
one or more slice modules configured to perform the user configurable system level testing of the devices under test (DUTs) coupled to the device interface boards (DIBs);

one or more power supply components configured to control the distribution of power to the devices under test (DUTs) coupled to device interface boards (DIBs);

a load board configured to couple the plurality of device interface boards (DIBs) to the one or more slice modules and the one or more power supply components; and a backplane interface configured to couple the one or more slice modules and the one or more power supply components to the backplane.

3. The test system of claim 2, wherein the slice module is configured to communicate information to the host controller via a standard communication protocol and standard modular removable communication connector.

4. The test system of claim 2, wherein the power supply component is configured to receive power from a standard utility outlet, convert the standard utility power into device under test power levels, and control delivery of power to the device under test.

5. The test system of claim 2, wherein the slice module includes a field programmable gate array (FPGA) and the FPGA is reprogrammable for different test protocols by loading different configuration firmware bit files.

6. The test system of claim 1, wherein the modular primitives are configured to independent control testing of the devices under test (DUTs) coupled by the device interface board (DIBs) to the modular primitive.

7. The test system of claim 1, wherein the host control is further configured to coordinate operation of the plurality of modular primitives.

8. The test system of claim 1, wherein the modular primitives are self-contained.

9. The test system of claim 1, wherein the backplane is further configured to communicatively couple the plurality of primitives together.

10. The test system of claim 1, wherein the primitives comprise Field Programmable Gate Array (FPGA) based test electronics configured to perform user configurable system level testing of the devices under test (DUTs) coupled to the device interface board (DIBs).

11. The test system of claim 1, wherein the primitives are configured by software executing on the host controller.

12. The test system of claim 1, wherein test flow and control of the user configurable system level testing of the devices under test (DUTs) is controlled by the primitives.

13. The test system of claim 1, wherein characterization of the devices under tests (DUTs) in response to the user configurable system level testing is performed by the primitive.

14. The test system of claim 1, wherein power profiling of the devices under tests (DUTs) in response to the system level function testing is performed by the primitive.

15. The test system of claim 1, wherein calibration and diagnostics of the plurality of primitives is performed by control software executing on the host controller.

16. The test system of claim 1, wherein environmental conditions of the devices under test (DUTs) during user configurable system level testing is controlled by the primitives.

17. The test system of claim 1, further comprising modularized automation equipment.

18. The test system of claim 17, wherein the modularized automation equipment includes one or more robotic DUT handlers.

19. The test system of claim 17, wherein the modularized automation equipment includes one or more device under test (DUT) racks.

20. The test system of claim 1, wherein the user configurable system level testing comprises research and development cycle testing.

21. The test system of claim 20, wherein the research and development cycle testing includes one or more of design verification testing and reliability demonstration testing.

22. The test system of claim 1, wherein the user configurable system level testing comprises production cycle testing.

23. The test system of claim 22, wherein the production cycle testing includes one or more of built-in self-testing and full-speed functional testing.

24. The test system of claim 1, wherein the user configurable system level testing includes fault detection and fault location.

25. The test system of claim 1, wherein control software executing on the host controller provides a universal graphics user interface for the plurality of primitives for testing of the devices under test (DUTs) coupled to the device interface board (DIBs).

26. The test system of claim 1, wherein:

the device interface boards (DIBs) further includes one or more environmental components configured to control one or more environmental conditions of the devices under test (DUTs) coupled to the device interface board (DIBs); and the primitives further includes an environmental component controller configured direct control of the environmental components of the device interface board.

27. The test system of claim 1, wherein the device interface boards (DIBs) further include an access interface configured to allow operator or robotic manipulation of the devices under test (DUTs).

28. The test system of claim 27, wherein the device interface boards (DIBs) and the primitives are configured to enable testing of one or more of the devices under test (DUTS) coupled to the device interface boards (DIBs) during the manipulation of one or more other devices under test (DUTs).

29. A test platform comprising:

one or more of a plurality of different modular means for removably coupling devices under test (DUTs) to the test platform, wherein the different means are configured to coupled different types of DUTs or DUTs with different form factors to the test platform, wherein the different means include;

one or more slots, rails, hangers or bays of one or more types for coupling a plurality of devices under test (DUTs) of one or more types or form factors to mechanically couple to the different means for removably coupling; and one or more connectors, sockets or plugs of one or more types for coupling to mating connectors, sockets or plugs on one or more types or form factors of devices under tests (DUTs) to couple signals and power between the different means for removable coupling and the devices under tests (DUTs)

a modular means for distributing power to the DUTs coupled to the test platform;

a modular means for user configuring a system level test; and a modular means for system level testing the DUTs coupled to the modular test platform.

30. The modular test platform claim 29, further comprising:

a modular means for autonomously handling the DUTs during coupling the DUTs to the test platform.

31. The modular test platform of claim 29, further comprising:
    a modular means, for controlling one or more environmental conditions during the system level testing of the DUTs coupled to the modular test platform.

32. The modular test platform of claim 29, further comprising:
    a modular means for determining fault location information for DUTs that fail the system level testing.

\* \* \* \* \*